(12) United States Patent
Schmelzer et al.

(10) Patent No.: US 8,842,704 B2
(45) Date of Patent: Sep. 23, 2014

(54) MULTIPLE PHASE-LOCKED LOOPS FOR HIGH-POWER RF-POWER COMBINERS

(75) Inventors: David P. Schmelzer, West Hartford, CT (US); W. Shef Robotham, Jr., Burlington, CT (US); Frederick W. Hauer, Windsor, CT (US); Joel Fontanella, Tolland, CT (US)

(73) Assignee: Coherent, Inc., Santa Clara, CA (US)

( * ) Notice: Subject to any disclaimer, the term of this patent is extended or adjusted under 35 U.S.C. 154(b) by 271 days.

(21) Appl. No.: 13/338,574

(22) Filed: Dec. 28, 2011

(65) Prior Publication Data

US 2013/0170512 A1      Jul. 4, 2013

(51) Int. Cl.
*H01S 3/13* (2006.01)

(52) U.S. Cl.
USPC ....... 372/29.012; 372/31; 372/28; 372/29.01; 372/38.02; 372/38.04; 372/38.07; 372/32; 372/55; 372/56; 372/57; 372/58; 372/59; 372/60; 372/61; 372/62; 372/63; 372/64

(58) Field of Classification Search
CPC ... H01S 3/09702; H01S 3/0975; H01S 3/139; H01S 3/1398; H01S 3/235
USPC .................. 372/29.012, 31, 28, 29.01, 38.02, 372/38.04, 55–65
See application file for complete search history.

(56) References Cited

U.S. PATENT DOCUMENTS

| 4,420,723 | A | 12/1983 | de Jager |
| 4,807,232 | A | 2/1989 | Hart et al. |
| 5,150,372 | A | 9/1992 | Nourrcier |
| 5,625,324 | A | 4/1997 | Hsu et al. |
| 5,790,942 | A | 8/1998 | Le Corre et al. |
| 7,157,942 | B2 * | 1/2007 | Meltzer ............................ 327/3 |
| 7,372,202 | B2 | 5/2008 | Eden et al. |
| 7,579,916 | B1 | 8/2009 | Mroch |
| 7,755,452 | B2 | 7/2010 | Knickerbocker et al. |
| 2005/0186918 | A1 | 8/2005 | Ramet et al. |
| 2013/0051416 | A1 * | 2/2013 | Schmelzer et al. ........ 372/38.07 |
| 2013/0202004 | A1 * | 8/2013 | Allie et al. ................ 372/29.02 |

FOREIGN PATENT DOCUMENTS

WO    00/17969 A1    3/2000

OTHER PUBLICATIONS

International Search Report and Written Opinion received for PCT Patent Application No. PCT/US2012/070737, mailed on May 10, 2013, 12 pages.
Razavi, Behzad, "RF Microelectronics: Chapter 8—Frequency Synthesizers", Prentice Hall Communications Engineering and Emerging Technologies Series, 1998, pp. 249-267.
Razavi, Behzad, "RF Microelectronics: Chapter 8—Frequency Synthesizers", Prentice Hall Communications Engineering and Emerging Technologies Series, 1998, pp. 285-289.
Schmelzer et al., U. S. Appl. No. 13/216,091, filed on Aug. 23, 2011, titled "Apparatus and Method for Balancing Combined RF Power Power Supplies for Driving A CO2 Gas-Discharge Laser", 22 pages.

* cited by examiner

*Primary Examiner* — Colleen Matthews
*Assistant Examiner* — Delma R Forde
(74) *Attorney, Agent, or Firm* — Morrison & Foerster LLP (57) ABSTRACT

An RF power-supply for driving a carbon dioxide $CO_2$ gas-discharge laser includes a plurality of power-oscillators phase-locked to a common reference oscillator. Outputs of the phase-locked power-oscillators are combined by a power combiner for delivery, via an impedance matching network, to discharge-electrodes of the laser. In one example the powers are analog power-oscillators. In another example, the power-oscillators are digital power-oscillators.

15 Claims, 7 Drawing Sheets

MULTIPLE PHASE-LOCKED LOOPS FOR HIGH-POWER RF-POWER COMBINERS

TECHNICAL FIELD OF THE INVENTION

The present invention relates in general to radio-frequency (RF) power-supplies for carbon-dioxide ($CO_2$) gas-discharge lasers. The invention relates in particular to such an RF power-supply including multiple RF-amplifiers, individual outputs of which are combined into a common output of the RF-power-supply.

DISCUSSION OF BACKGROUND ART

In a $CO_2$ gas-discharge laser, a lasing gas mixture within a laser-housing is energized by a radio-frequency (RF) discharge in the gas mixture. The discharge is struck between a pair of parallel spaced-apart electrodes. In a high-power $CO_2$ laser, for example, a $CO_2$ slab laser having an output power of 100 Watts (W) or more, the gas mixture typically includes $CO_2$, nitrogen ($N_2$), and helium (He), and is at a pressure between about 50 and 150 Torr. RF power for energizing the gas discharge is provided by the combined output of a plurality of RF power-amplifiers. These amplifiers are supplied by a single RF oscillator, the output of which is optionally pre-amplified.

In order to excite a gas discharge in a $CO_2$ slab laser, an RF voltage of about 225 Volts (V) at a drive-frequency between about 80 and 100 megahertz (MHz) is required. Current in the discharge for a constant voltage applied to the electrodes increases linearly with power delivered into the discharge. The impedance of the discharge decreases as the RF power into the discharge is increased. A $CO_2$ slab laser has an efficiency of about 10% for converting RF power into the discharge to laser-output power. By way of example, a $CO_2$ laser having 250 W output requires about 2500 W of RF power at a current of about 11 Amps (A) to be delivered into the discharge. The impedance of the discharge is about 20 Ohms ($\Omega$).

RF power-amplifiers are typically power transistor (MOSFET) modules, such as BLF278 modules available from Philips Corporation of Eindhoven, Holland. In order to provide 2500 W of RF power, a minimum of six BLF278 modules would be required. The outputs of the modules would need to be combined to form a single output that is provided to the discharge electrodes.

Figure 1:
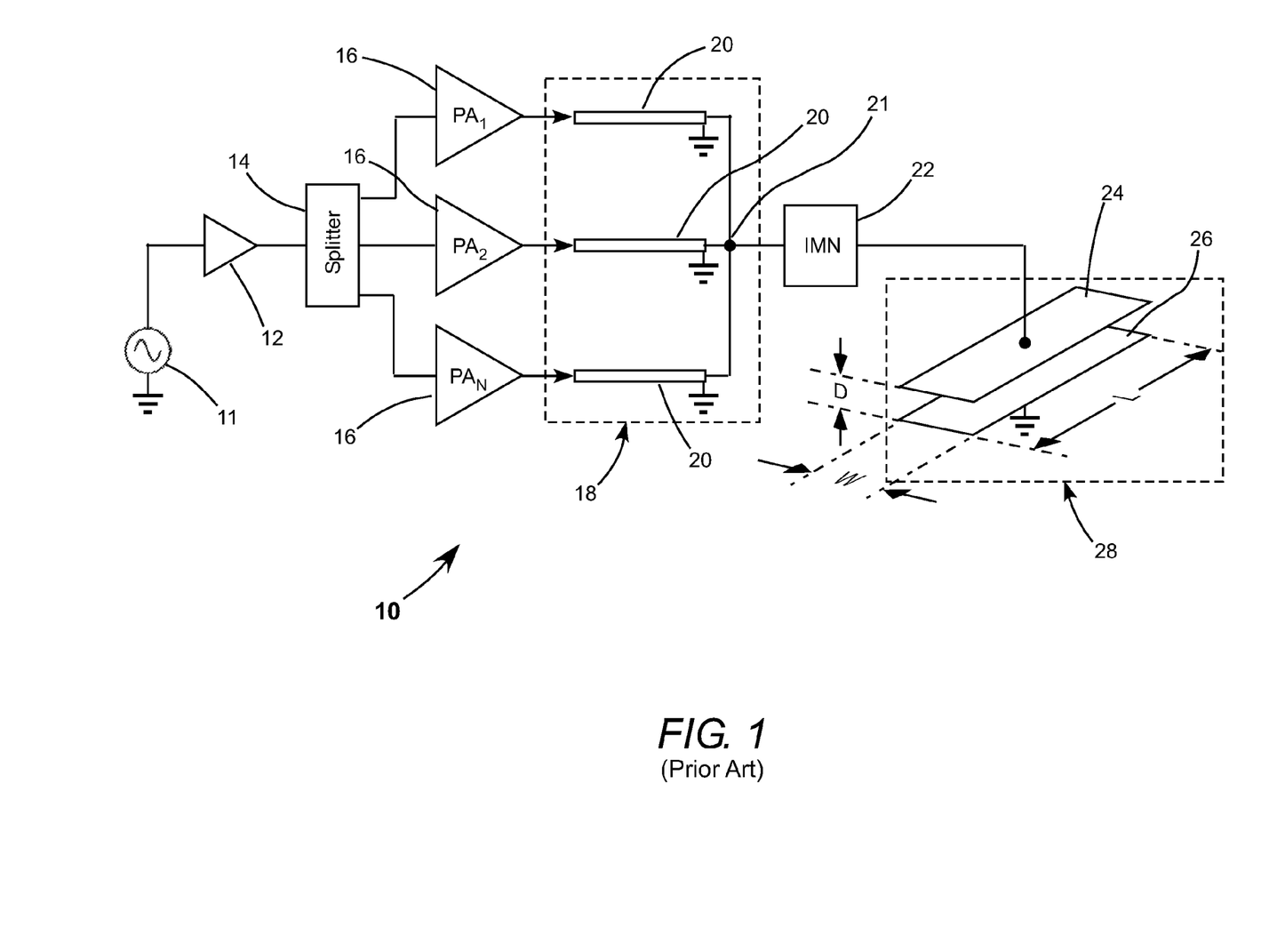
FIG. 1 schematically illustrates a prior-art arrangement for driving a $CO_2$ gas discharge laser using combined outputs of a plurality of RF power-amplifiers, including a RF oscillator, a pre-amplifier for amplifying the output of the RF oscillator, a splitter dividing the pre-amplified output into three parts with each part amplified by a corresponding power-amplifier, and a power-combiner for combining the outputs of the three RF power amplifiers, with the combined connected to discharge electrodes via an impedance matching network.

FIG. 1 schematically illustrates a prior-art RF-power combining arrangement 10 for driving a $CO_2$ gas discharge laser. This arrangement is described in detail in U.S. Pat. No. 7,755,452, assigned to the assignee of the present invention, and the complete disclosure of which is hereby incorporated by reference. Only a brief description of the arrangement is presented here.

Arrangement 10 includes a stable RF oscillator 11, usually having a frequency between about 80 and 100 MHz as noted above. The oscillator output is pre-amplified by an amplifier 12. RF-output of the pre-amplifier is split by an N-way splitter 14, here, into three parts. Each part is connected to a corresponding power-amplifier 16. The amplifiers are designated $PA_1$, $PA_2$ and $PA_3$. The choice of a three-way split with three power-amplifiers, here, is for convenience of description. The arrangement is effective with less than three power-amplifiers, or more than three power-amplifiers. Typically there would be an impedance-matching network between each splitter output and the corresponding power amplifier. These are not shown in FIG. 1 for convenience of illustration.

The number of parallel power amplifiers 16 is determined by the amount of RF power $P_L$ desired to be delivered to the load, divided by the power output rating of the power-amplifiers. The load, in this instance, is a discharge generated between a live or "hot" electrode 24 and a spaced-apart parallel ground electrode 26. The electrodes are located in a hermetically sealed laser housing 28 containing a lasing gas mixture, as discussed above. The load-impedance is determined, inter alia, by the length (L) and width (W) of the electrodes; the spacing (D) between the electrodes; and the pressure of the gas mixture. The impedance is higher when there is no lasing discharge struck between the electrodes.

The outputs of the power-amplifiers 16 are each connected to the inner conductor of a corresponding one of three co-axial transmission lines (cables) 20 having characteristic impedance $Z_0$, with the outer conductor grounded at each end of the line as shown in FIG. 1. Strip line technology can be substituted for the co-axial cable for better compatibility with modern printed circuited board (PCB) technology. The center conductors of the cables are connected to a common node 21. The characteristic impedance at node 21 is $Z_0/3$, i.e., $Z_0$ divided by the number of amplifier outputs being combined. An impedance matching network (IMN) 22 is located between node 21 of power combiner 18 to match the impedance at the common node to the impedance of the laser discharge generated in the gap D between electrodes 24 and 26.

A problem that needs to be addressed in combining the outputs of multiple transistor power-amplifier modules is current-balancing and phase-adjustment of the outputs of each of the individual amplifiers. This is required in order to transfer maximum power into the load with maximum overall efficiency. If not efficiently combined, the transistor power amplifiers will experience additional losses which will manifest themselves as heat dissipation. Current balancing and phase adjustment is a tedious iterative procedure that is typically carried out manually. This current (amplitude) and phase balancing involves providing a variable reactance, such as a shunt variable capacitor, at the input of each of the power amplifiers to be balanced. This current and phase balancing procedure is complicated by cross-talk between the power-amplifier modules.

A current (amplitude) and phase-balancing method and apparatus that speeds the iterative process somewhat, by reducing the cross-talk problem, is described in U.S. patent application Ser. No. 13/216,091, filed Aug. 23, 2011, assigned to the assignee of the present invention, and the complete disclosure of which is hereby incorporated by reference. The cross-talk problem is limited by providing switches or removable links, which allow current and phase balancing to be performed sequentially on an amplifier pair with others temporarily disconnected. The amplitude and phase of any amplifier is adjusted by means of the variable reactance shunt at the amplifier input as discussed above. The procedure is still an iterative, manual procedure but is somewhat shortened by the pair-wise execution. It would be advantageous, however, if at least one aspect of the current and phase-balancing could be made automatic.

SUMMARY OF THE INVENTION

The present invention is directed to RF power-supply apparatus for driving a gas-discharge laser. In one aspect apparatus in accordance with the present invention comprises a reference oscillator having RF output at a first frequency. A plurality of power-oscillators is provided. Each power-oscillator has an output at a second frequency, and is phase-locked to the output frequency of the reference oscillator. A power combiner is arranged to combine the outputs of the power oscillators into a single combined output for driving the gas-discharge laser.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 2:
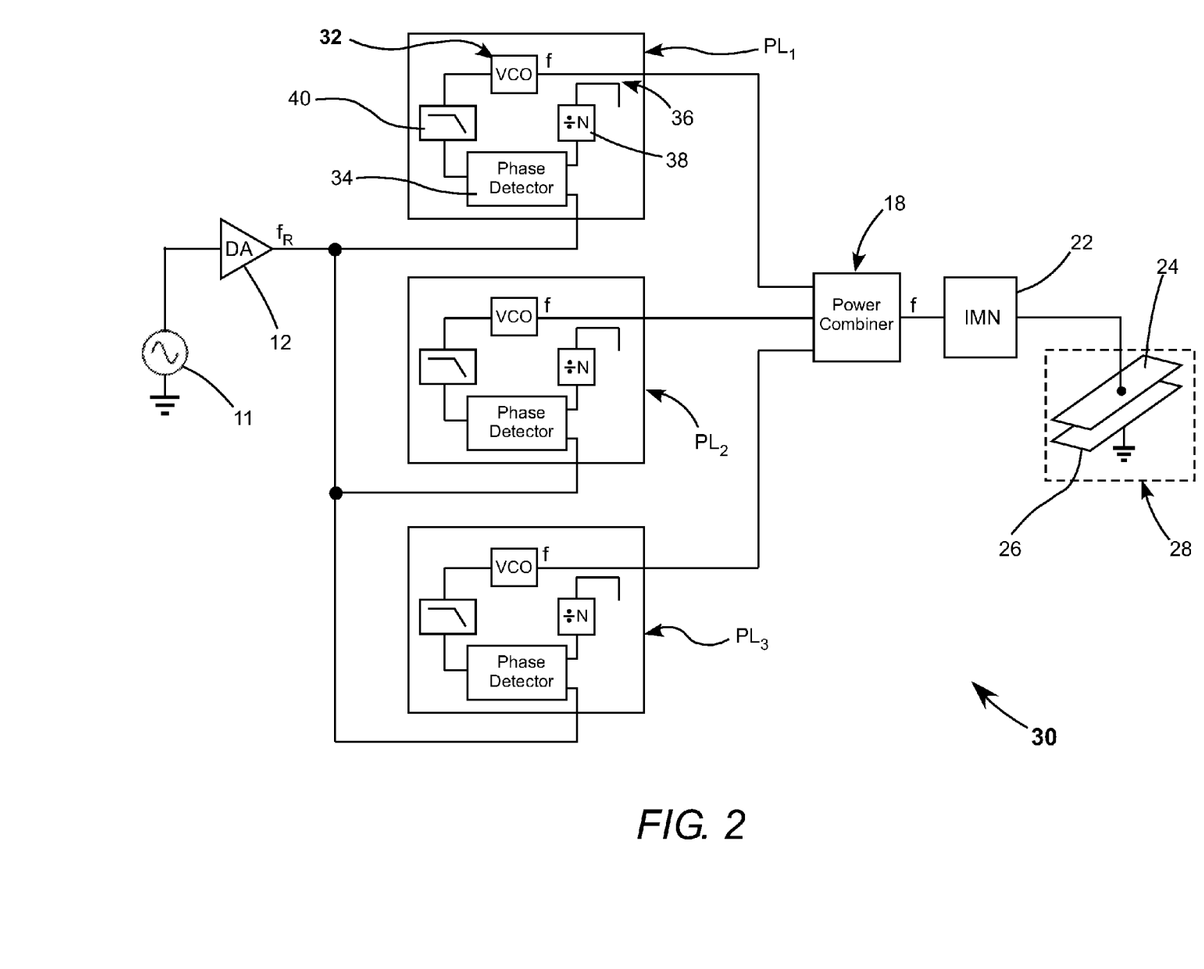
FIG. 2 schematically illustrates one preferred embodiment of a RF driving arrangement in accordance with the present invention for a $CO_2$ gas-discharge laser, the arrangement including a plurality of analog power-oscillators, each thereof including a voltage controlled oscillator, the power-oscillators being phase-locked to a common reference oscillator with outputs of the phase-locked power-oscillators being combined by a power combiner for delivery via an impedance matching network to discharge-electrodes of the laser.

Continuing with reference to the drawings, wherein like components are designated by like reference numerals, FIG. 2 schematically illustrates one preferred embodiment 30 of a $CO_2$ gas-discharge laser driving arrangement (RF power-supply (RFPS) arrangement) in accordance with the present invention. In arrangement 30, the plurality (here, three) of power-amplifiers 16 of the prior-art arrangement of FIG. 1 are replaced by three high-power variable-frequency voltage controlled oscillators (power-oscillators) 32 arranged as components of a corresponding three analog phase-locked power-oscillator loops $PL_1$, $PL_2$ and $PL_3$, hereinafter referred to simply as phase-locked loops. In each of the phase-locked loops, there is a variable frequency power-oscillator 32 and a phase-detector 34. One suitable phase detector is a model 4106 or 4102, available from Analog Devices Corporation of Norwood, Mass. Power-oscillator 32 can be referred to as a voltage controlled oscillator (VCO).

RF oscillator 11 and driver amplifier (DA) 12 of the arrangement of FIG. 1 here provide an input reference signal $f_R$ which is communicated to each of the three phase-locked loops as an input reference signal. One suitable driver amplifier is a Model AD9523-1 also available from Analog Devices Corporation. The operation of the phase-locked loops is described with reference to $PL_1$, and is the same for loops $PL_2$ and $PL_3$.

Phase-detector 34 compares the phase of input reference signal $f_R$ with the phase of a signal derived from the VCO output, which has frequency f. An error signal from phase detector 34 adjusts the frequency of the VCO output signal to be in phase with the input reference oscillator signal. The reference frequency $f_R$ is an Nth sub-harmonic of frequency f.

Frequency f is in the usual frequency-range of RF power-supplies for $CO_2$ lasers, for example, about 100 MHz. A frequency divider 38 divides frequency f by the integer sub-harmonic number N, for example about ten or more, to bring the frequency fed to the phase-detector close to the lower reference frequency $f_R$. In the above referenced 4106 or 4102 phase-detectors, a frequency divider is an integral component thereof. Frequency $f_R$ is selected to be efficiently transmitted around a PCB using strip line technology.

Figure 2A:
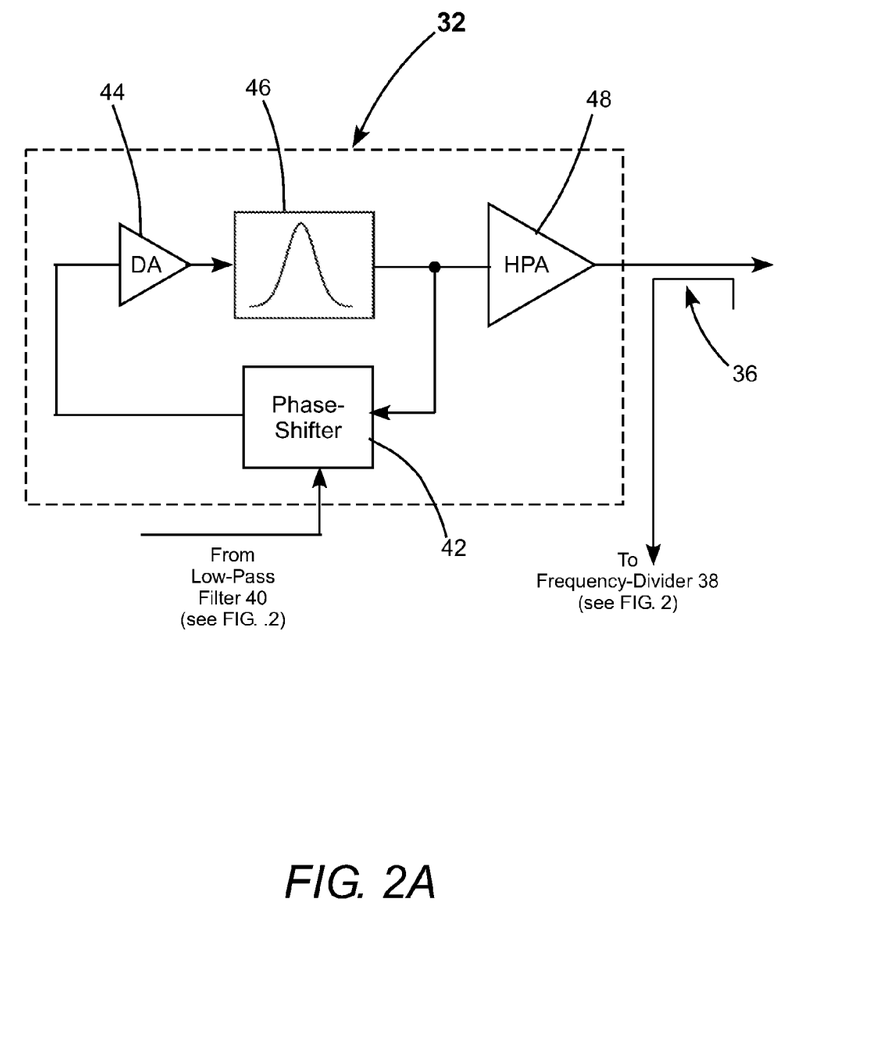
FIG. 2A schematically illustrates details of the voltage controlled oscillator in a power-oscillator of FIG. 2.

FIG. 2A schematically illustrates, in block diagram form, components of a VCO or power-oscillator 32. VCO 32 includes a phase-shifter 42; a driver amplifier 44; a band-pass filter 46 having a center frequency at frequency f; and a power amplifier 48. Power amplifier 48 while represented by a single amplifier symbol may include one or more transistor amplifier modules. One suitable phase-shifter that utilizes a varactor diode is a model MV104 phase-shifter available from ON Semiconductor Corporation of Phoenix, Ariz. One suitable power amplifier is a model BLF278 available from Philips of Eindhoven, Holland. For purposes of this description and the appended claims, the VCO including the driver amplifier and the power amplifier can be referred to simply as an analog power-oscillator.

Phase-shifter 42 receives a phase-error signal from low pass filter 40 of FIG. 2. There is a feed-back path from band-pass filter 46 to phase-shifter 42 this cooperative with the gain of the driver amplifier, causes the VCO circuit to resonate, i.e., oscillate, locked to the frequency f, which is Nth harmonic of the reference frequency $f_R$.

As frequency is the derivative of phase, keeping the input and output phase of the amplifier and band-pass filter combination in lock-step keeps the input and output frequency of the VCO locked at a frequency f which is an integer multiple of the reference frequency $f_R$. This is the purpose of the phase-locked loop.

The phases of the outputs of the three phase-locked loops $PL_1$, $PL_2$, $PL_3$ of FIG. 2 may be slightly different but will be within about one percent variation, which has been found to be adequate for efficient power transfer to the discharge electrodes. The output phase of the power combiner will be about the average of the output phases of the individual phase-locked loops.

Regarding functionality of circuit components discussed above, the phase-error signal passed by low-pass filter 40 is used to vary the phase of the feedback signal propagated through phase-shifter 42 of FIG. 2A. A reversed biased varactor diode (not shown) is at the heart of phase-shifter 42. Variation of the varactor diode DC bias voltage by the phase-error signal from low-pass filter 40 changes the capacitance of the varactor diode, which in turn varies the phase of the frequency f. The varactor diode is part of an inductive-capacitive circuit (not shown) constituting the phase-shifter. The output frequency of the VCO 32, can be adjusted within a small frequency range of about a few MHz around the peak frequency of the band-pass filter 46 by the phase-error signal of the low-pass filter 40 of FIG. 2 and applied to phase-shifter 42.

One of the inputs to phase-detector in any phase-locked loop is the output of the RF frequency-divider 38 which divides the VCO output frequency f by N so that $f=f_R N$. The other input to the phase-detector is the reference frequency $f_r$ provided by the output of driver amplifier 12. The feedback loops provide a quick self-readjustment so that the frequencies of the two input signals provided to the phase-detector become identical. As the phase detector requires two inputs at all times to perform the phase-locking task, and since one of these two inputs is the output of the frequency-divider 38, the signal from divider 38 goes to zero when the output from the power-oscillator goes to zero. Because of this, the arrangement of FIG. 2 is suitable only for CW operation of a laser driven thereby. By the addition of an appropriate sample and hold circuit, or other suitable circuit, to the VCO 32 input, the general approach of FIG. 2 can be applied to certain pulsed operating conditions. This is discussed further hereinbelow.

The output of phase-detector 34 is a voltage providing a phase-error signal, the amplitude of which is linearly proportional to the phase difference between the two input signals to the phase detector. This voltage provided to phase-shifter 42 of FIG. 2A is zero when the phase between the two input signals to the phase-detector is the same, and increases proportionally as the phase-difference increases. The purpose of frequency divider 38 is to enable the reference signal $f_R$ to be low enough so it can be transmitted around a printed circuit board (PCB) via strip-line transmission line technology with low losses, thereby providing a reference signal to all of the phase-locked loops with low loss.

The purpose of directional coupler 36 of FIG. 2 is to sample a small amount of the VCO output and provide this sampled output to frequency divider 38. Such a directional coupler may consist of two coupled parallel strip-lines deposited on a PCB surface. The purpose of low-pass filter 40 is to suppress any high-frequency fluctuations in the phase-error output from the phase-detector, thereby obtaining finer control of the VCO output frequency.

As all the three VCOs 32 contained within three phase-locked loops $PL_1$, $PL_2$, and $PL_3$ are driven by the same reference oscillator 11, the frequency and phase of all the phase-locked loop outputs are the same, and phase-balancing is not required. Some amplitude balancing of the outputs of the phase-locked loops may be necessary to improve the power-transfer, for example by varying input signal amplitudes to the phase-locked loops with a variable shunt capacitor or the like. This, however, can now be done independent of phase-balancing which reduces the time required for balancing by 2 hours per RFPS for a 1000 W laser.

Figure 2B:
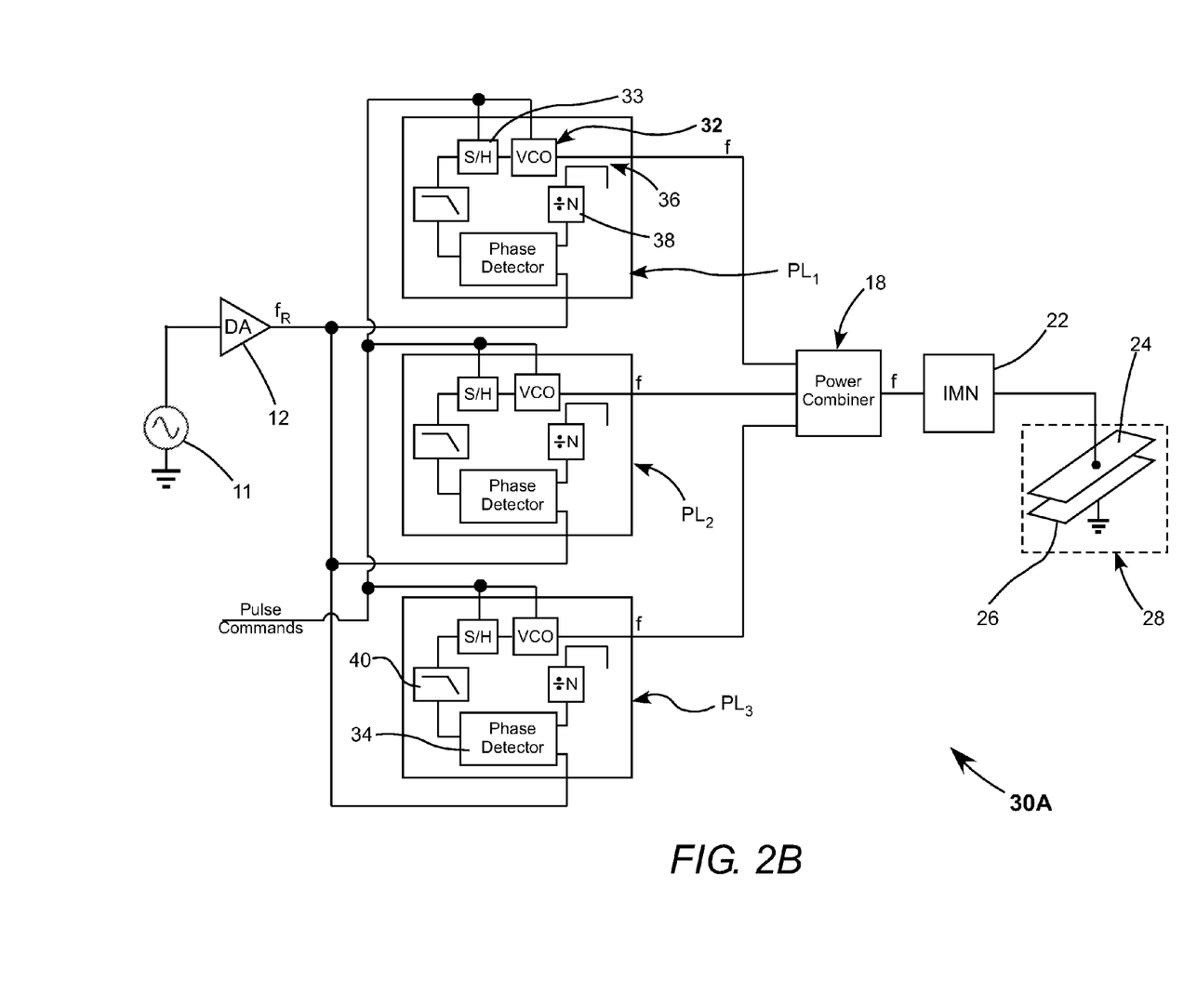
FIG. 2B schematically illustrates the arrangement of FIG. 2 adapted for driving in either a CW or pulsed mode.

As noted above, the analog RFPS arrangement of FIG. 2 is suitable only for CW operation, because phase-detector 34 will go to an unknown state if VCO 32 is turned off. There will be a large transient voltage spike at the phase-detector output when the VCO is turned on to initiate a pulse. There will also be a start-up time necessary to achieve phase-lock each time the RF output transitions from an off to an on state. These deficiencies can be minimized when operating the inventive analog phase-locked loop RFPS in a pulsed-mode using an arrangement 30A depicted in FIG. 2B. Arrangement 30A is essentially arrangement 30 of FIG. 2 with a sample and hold (S/H) circuit 33 between low pass filter 40 and VCO 32. Sample and hold circuits are well known in the electronic arts and, accordingly a detailed description thereof is not presented herein. An equally well-known track-and-hold circuit or an analog-to-digital converter circuit could also be substituted for sample and hold circuit 33.

Pulse commands (voltage pulses) for pulsed operation are communicated to sample and hold circuit 33 and VCO 32. It should be noted here that an S/H circuit includes an inverter such that the pulse command (modulating) signal effectively applied to the S/H circuit is the inverse of the modulating signal applied to VCO 32. The commands turn VCO 32 on or off by turning on or off amplifier (HPA) 48 of the VCO (see FIG. 2A). During pulsed operation, the modulating signal applied to the sample and hold circuit maintains the control voltage applied to phase-shifter 34 of VCO 32 whenever the RF is commanded off. The voltage provided by the sample and hold circuit prevents a large transient frequency-shift and large voltage spikes from occurring at the RFPS output after the RF modulated signal transitions from an "off" to an "on" state. This approach may not eliminate the transient signal completely so it may be necessary to make fine adjustments to the sample and hold circuit to minimize the transient signal.

Those skilled in the electronic art will recognize that a phase-locked loop can be implemented using either an analog or digital approach, using commercially available components, or components such a low-pass filters or band-pass filters built using well-known reactive circuits. Accordingly, the preferred embodiment of the presentation discussed above, and other preferred embodiments described herein below, are described primarily with reference to components at high level.

Figure 3:
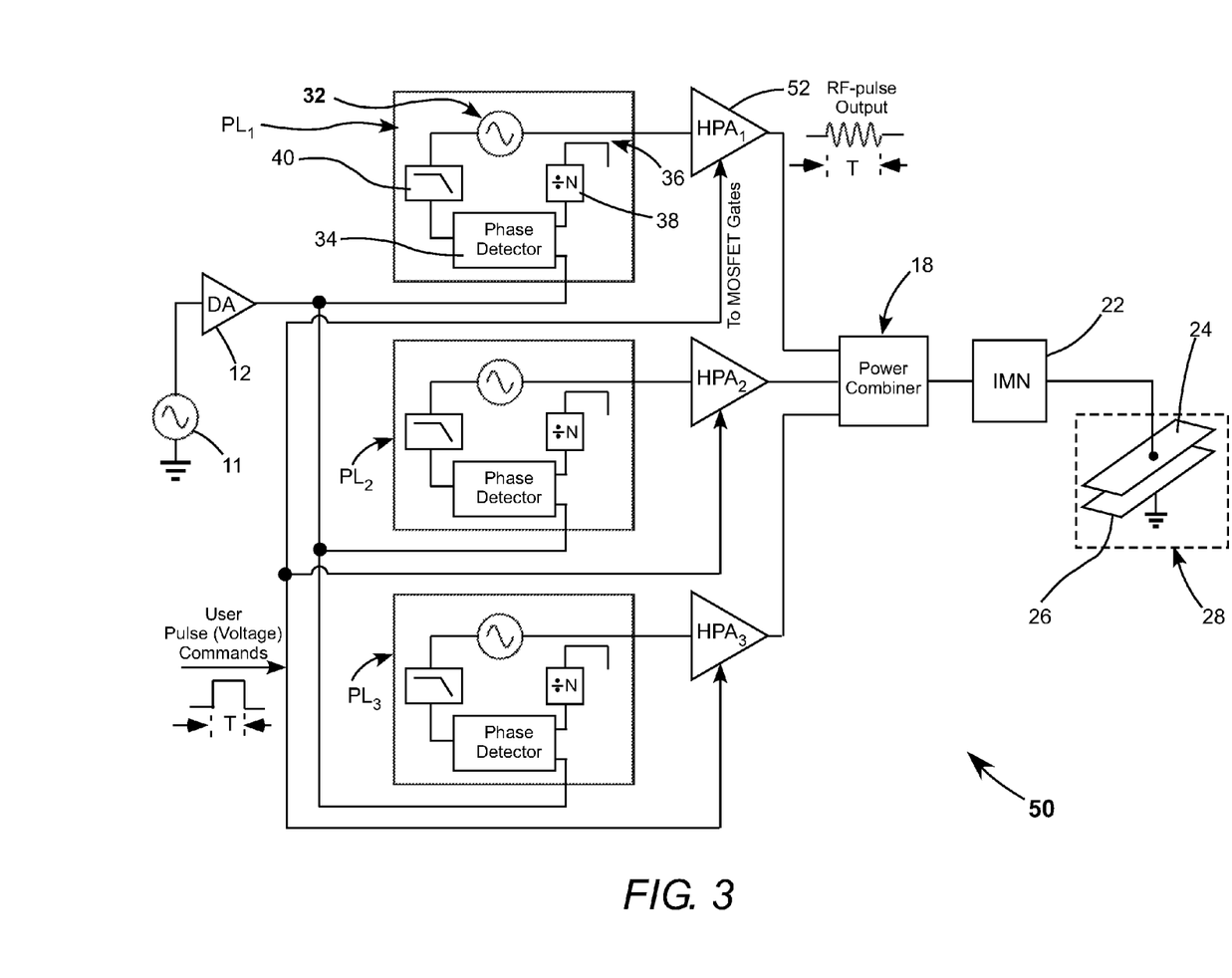
FIG. 3 schematically illustrates another preferred embodiment of a RF driving arrangement in accordance with the present invention for a $CO_2$ gas-discharge laser, similar to the embodiment of FIG. 2 but wherein the outputs of the plurality of analog power-oscillators are further amplified by a corresponding plurality of power amplifiers before being combined, and wherein the arrangement can be operated in a pulsed mode by simultaneously switching on and off the plurality of power amplifiers.

FIG. 3 schematically illustrates another preferred embodiment 50 of a $CO_2$ gas-laser driving arrangement (RFPS arrangement) in accordance with the present invention which permits pulsed operation, albeit at the expense of somewhat compromising the automatic phase balancing feature of arrangement 10 of FIG. 2. Arrangement 50 is similar to arrangement 10 of FIG. 2, with an exception that a high power amplifier is added to the output of each of phase-locked loops $PL_1$, $PL_2$, and $PL_3$, following the directional couplers thereof. These amplifiers are designated $HPA_1$, $HPA_2$, and $HPA_3$, respectively. These are preferably LD-MOSFET (transistor module) amplifiers. Such amplifiers require about 5 W input from the VCO output to deliver full power of about 1000 W at their output. In this arrangement, the phase-locked loops run in a CW mode as described above, so there are always two finite signals input into phase-detectors 34 of the phase-locked loops.

Pulsed operation in arrangement 50 is obtained by providing pulsed command signals to the gates high power transistor modules (not shown) in the high power amplifiers (HPAs). A first function of each HPA 52 is as a power amplifier, the output of which is combined into a single output by RF power combiner 18, and connected via impedance matching network 22 to discharge electrodes 24 and 26 in laser enclosure 28. A second function of each HPA is to serve as a fast RF switch for chopping the continuous RF output of the corresponding phase-locked loop into RF pulses when commanded by the user. The user commands are in the form of DC-voltage pulse signals, applied for a duration T, simultaneously to the (transistor gates) of the HPAs. The DC voltage signal results in an RF-pulse being delivered by each HPA. The RF pulse has a duration T and a frequency f. By operating the HPAs in a reduced duty-cycle mode, the peak power of the output RF pulses can be increased above the CW average power level of the HPAs, thereby yielding higher peak-power laser-pulses while maintaining the same average power as in CW operation.

While the inputs to $HPA_1$, $HPA_2$, and $HPA_3$ will be in phase because of the phase-locked loops $PL_1$, $PL_2$, and $PL_3$, respectively, any differences in reactance between the HPAs will cause variations in between the amplifier outputs to be combined by power combiner 18. This will somewhat compromise the self phase-balancing arrangement of the CW arrangement of FIG. 2. An adjustable reactance circuit, such as a variable shunt capacitor, can be provided at the input of each HPA to allow manual phase-balancing as described above.

Figure 4:
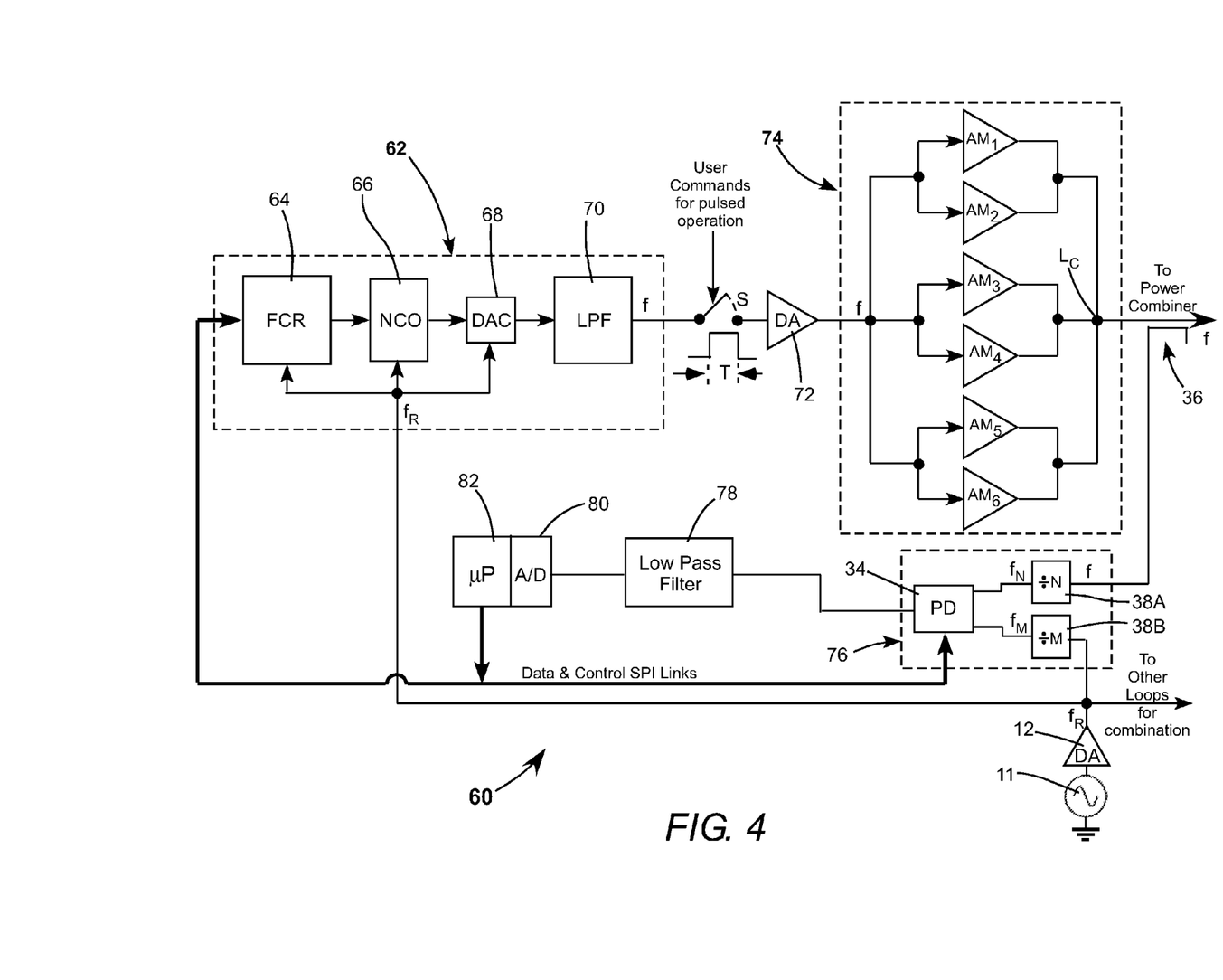
FIG. 4 schematically illustrates one unit of yet another embodiment of a RF driving arrangement in accordance with the present invention for a $CO_2$ gas-discharge laser, the unit being a digital power-oscillator phase-locked to a common reference oscillator with the oscillator being a direct digital synthesizer, power amplification being provided by a parallel amplifier array, and the arrangement being controlled by a microprocessor.

FIG. 4 schematically illustrates yet another preferred embodiment 60 of one phase-locked loop oscillator-amplifier unit of a RFPS arrangement in accordance with the present invention for driving a $CO_2$ gas-discharge laser. In this arrangement the phase-locked loop is a digital arrangement based on a direct digital synthesizer (DDS) 62 instead of the analog VCO of the arrangement of FIG. 2. This digital phase-locked loop oscillator-amplifier unit would be substituted for one VCO-based analog phase-locked loop in the arrangement 30 of FIG. 2. Components of arrangement 30 common to arrangement 60 are designated by like reference numerals.

DDS 62 includes a frequency-control register (FCR) 64, a numerically controlled oscillator (NCO) 66, a digital-to-analog converter (DAC) 68, and a low-pass filter (LPF) 70. A direct digital synthesizer including the referenced components therein is available such as a model AD9913 from Analog Devices Corporation. A reference frequency $f_R$ signal is provided by a RF oscillator 11 the output of which is amplified by a driver amplifier 12, as in other above-described arrangements. The (amplified) reference-frequency signal $f_R$ provides a stable time-base for the arrangement and determines the frequency accuracy of DDS 62. Signal $f_R$ provides a clock signal for NCO 66 which outputs a discrete-time, quantized (digital) version (a digital waveform) of a system-frequency (discharge-driving frequency) f. The period of the digital signal f is controlled by a digital word contained in FCR 64. The digital waveform from NCO 66 is converted to an analog waveform by DAC 68. LPF 70 provides smoothing of the analog signal from DAC 68 and forwards the analog signal to an RF switch S. One suitable RF switch is a model AD901 from Analog device Corporation.

A user commands the switch S to open or close by providing voltage pulses to the switch. Opening or closing switch S respectively prevents or allows RF signal f from DDS 62 from reaching a driver amplifier 72 which provides input to an amplifier array 74. Amplifier array 74 includes an even plurality, here six, of power-transistor amplifier-modules (MOSFETS) designated $AM_1$, $AM_2$, $AM_3$, $AM_4$, $AM_5$, and $AM_6$, with pairs thereof in a push-pull arrangement. Each of these can be modules can be the above-referenced model BLF278 transistor modules. In this configuration, driver amplifier 72 preferably amplifies the signal received from DDS 62 to a level sufficient to drive the amplifier modules of array 74 into saturation, i.e., into class C operation, for maximum efficiency of operation.

Amplifier array 74 can be compared with what is depicted by a single amplifier symbol 48 in FIG. 2A where it is arbitrarily regarded as being a part of VCO 32 of FIG. 2. As noted above, amplifier 48 can include one of more transistor modules. In either case, the invention is not limited to any particular combination of transistor-amplifier modules in a power amplifier arrangement. For purposes of this description and the appended claims, the combination of DDS 62, driver amplifier 72 and amplifier array 74 can be referred to simply as a digital power-oscillator.

Transistor amplifier modules $AM_{1-6}$ depicted in FIG. 4 are only current-balanced before being placed in arrangement 60. Due to the above-discussed reactance variation that is encountered between nominally identical, commercially available transistor amplifier modules, it is not unusual for each of the frequency signals emitted by each module to have a slightly different phase. The outputs of all the amplifier modules in array 74 are combined at a common node $L_C$. A directional coupler 36 samples the combined outputs for the phase-locked loop. The combined outputs will have a phase that is the average of the phases of the individual modules in the array. Additional loops (not shown) are configured as in arrangement 60 and phase-locked to the reference frequency $f_R$ as indicated in FIG. 4. The amplifier arrays arrangement 60 and additional similar phase-locked loops are combined by a power combiner such as power combiner 18 in the arrangement of FIG. 2. The average phases of each of the loops combined are automatically equalized, thus providing the automatic phase-balancing advantage of arrangement 30 of FIG. 2.

Continuing with reference to FIG. 4, in the phase-locking mechanism of arrangement 60, the single combined output from node $L_C$ is sampled by directional coupler 36. In a phase detector module 76, the sampled signal from coupler 36, having a frequency f, is frequency-divided by an integer N by a frequency divider 38A. The output of divider 38A, having a frequency $f_N$ is connected to one of the inputs of a phase-detector 34 in module 76. A signal from DA 12 having frequency $f_R$ is input to module 76 and frequency divided by an integer M by another frequency divider 38B. The output of divider 38B, having a frequency $f_M$ is connected to the other input of phase-detector 34. The values of N and M are chosen such that $f_N = f_m$ so that phase detector 34 can compare the phases of the input signals.

If the phases are not equal, the phase-detector generates a phase-error signal which is passed through a low-pass filter 78 to smooth out any noise on the phase-error signal. The smoothed signal is passed to an analog-to-digital converter (A/D) 80 then in digital form to a microprocessor (μP) 82. One suitable microprocessor is a model PIC18F4685 available from Microchip Technology Inc. of Chandler, Ariz. This microprocessor has an A/D converter as an integral feature. The microprocessor processes the phase-error signal and transmits the processed signal to FCR 64 in DDS 62 to adjust the phase off-set word within the FCR functionality, such that output of array 74 sampled by directional coupler 36 is in phase with the common reference signal 30. The microprocessor, accordingly, includes the equivalent of the phase-shifter 42 function in VCO 32 of FIG. 2. Digital information is transmitted from microprocessor 82 to the FCR in the DDS by means of data and control serial peripherals interface (SPI) links, depicted in FIG. 4 as a single connection, for convenience of illustration.

Microprocessor 82 can be programmed in a manner such that when the RFPS arrangement of arrangement 60 is operated in a pulsed mode by opening and closing switch S, when no signal is detected by directional coupler 36, i.e., in a period between pulses, the last phase-error signal can be used to set the phase of the DDS until switch S is closed. Then another phase-error signal can be generated from the output of amplifier array 74 sampled by directional coupler 36. Arrangement 60, of course, can also be operated in a CW mode. Simply stated, the microprocessor causes DDS 62 to function like a VCO that remembers its phase when it is switched off.

Microprocessor 82 can also be programmed to turn off phase-detector 34 via the data and control links depicted in FIG. 4. This might be done, for example, during start up of a laser, with the phase-detector, and the phase-locking function being turned back on by the microprocessor after a time sufficient to allow the laser output to become nominally stabilized.

Figure 5:
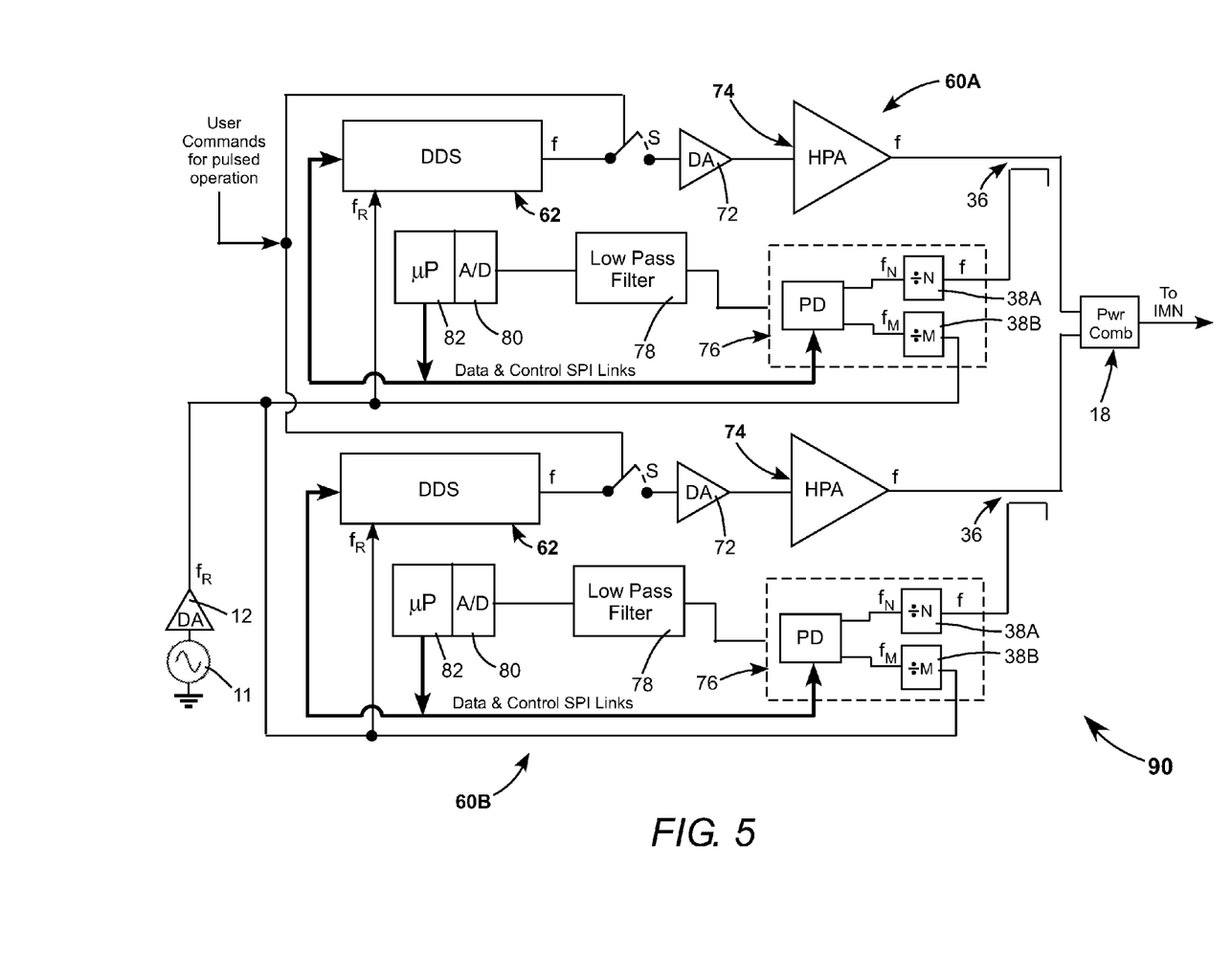
FIG. 5 schematically illustrates two of the units of the driving arrangement shown in FIG. 4, phase-locked to a common reference oscillator with the outputs of the power amplifier arrays of the units combined by a power combiner for delivery to discharge electrodes of the $CO_2$ gas-discharge laser.

FIG. 5 schematically illustrates an RFPS 90 in accordance with the present invention, wherein two arrangements 60, here, designated 60A and 60B, have outputs thereof combined by a power combiner 18. The combined output from the power combiner is transmitted via an impedance matching network (IMN) to discharge electrodes (not shown). Certain components of arrangement 60 are depicted at high level for convenience of illustration. Arrangements 60A and 60B are phase-locked to common reference oscillator 11 as discussed above. User pulse commands are delivered simultaneously to the RF switch S in each of arrangements 60A and 60B. Those skilled in the art will recognize that 3 or more arrangements 60 can be combined in the same manner as the two arrangements depicted in FIG. 5.

In summary, the present invention is described above in terms of preferred embodiments. The invention is not limited, however, to the embodiments described and depicted. Rather, the invention is defined by the claims appended hereto.

What is claimed is:

1. Radio frequency (RF) power-supply apparatus for driving a gas-discharge laser, the apparatus comprising:
   a reference oscillator generating an RF output at a first frequency;
   a plurality of power-oscillators each thereof generating an RF output at a second common frequency, and each thereof phase-locked to the output frequency of the reference oscillator, each said power-oscillator including an oscillator and one or more stages of RF power amplification; and
   a power combiner arranged to combine the outputs of the power oscillators into a single combined output for driving the gas-discharge laser.

2. The apparatus of claim 1, wherein the second frequency is a harmonic of the first frequency.

3. The apparatus of claim 1, wherein the oscillators of the power-oscillators are analog power oscillators including a voltage controlled oscillator (VCO).

4. The apparatus of claim 1, wherein the oscillators of the power-oscillators are digital power-oscillators including a direct digital synthesizer (DDS).

5. The apparatus of claim 4, wherein each of the power-oscillators includes switching means for selectively enabling and disabling the output thereof, the switching arrangements being simultaneously operable for providing that the combined output of the power-oscillators is in a pulsed form.

6. The apparatus of claim 5, wherein the switching means includes an RF switch located between the DDS and the one or more amplification stages.

7. The apparatus of claim 6, wherein the RF switches are simultaneously operable in response to a single common switch command signal.

8. A gas laser apparatus comprising:
   a sealed housing containing a laser gas and a pair of discharge electrodes,
   a radio frequency (RF) power-supply connected to the electrodes for generating a gas discharge within the housing, said power supply including:
   a reference oscillator generating an RF output at a first frequency;
   a plurality of power-oscillators each thereof generating an RF output at a second common frequency, each said power-oscillator including an oscillator and one or more stages of RF power amplification;
   a power combiner arranged to combine the outputs of the power oscillators into a single combined output and electrically connected to the electrodes wherein each of the outputs of the power-oscillators is phase-locked to the output frequency of the reference oscillator.

9. The apparatus of claim 8, wherein the second frequency is a harmonic of the first frequency.

10. The apparatus of claim 8, wherein the oscillators of the power-oscillators are analog power oscillators including a voltage controlled oscillator (VCO).

11. The apparatus of claim 8, wherein the oscillators of the power-oscillators are digital power-oscillators including a direct digital synthesizer (DDS).

12. The apparatus of claim 11 wherein the one or more stages of amplification include a driver amplifier feeding an even plurality of amplifier modules, with pairs of the modules connected in parallel in a push-pulse mode, and with the push-pull pairs of modules also being connected in parallel.

13. The apparatus of claim 11, wherein each of the power-oscillators includes switching means for selectively enabling and disabling the output thereof, the switching arrangements being simultaneously operable for providing that the combined output of the power-oscillators is in a pulsed form.

14. The apparatus of claim 13, wherein the switching means includes an RF switch located between the DDS and the one or more amplification stages.

15. The apparatus of claim 14, wherein the RF switches are simultaneously operable in response to a single common switch command signal.

* * * * *